(12) United States Patent
Li et al.

(10) Patent No.: US 10,718,788 B2
(45) Date of Patent: Jul. 21, 2020

(54) ELECTRONIC PRODUCT TEST JIG

(71) Applicant: SHENZHEN ULMT TECHNOLOGY CO., LTD, Shenzhen, Guangdong (CN)

(72) Inventors: Lijin Li, Guangdong (CN); Daoxu Zheng, Guangdong (CN)

(73) Assignee: SHENZHEN ULMT TECHNOLOGY CO., LTD, Shenzhen (CN)

( * ) Notice: Subject to any disclaimer, the term of this patent is extended or adjusted under 35 U.S.C. 154(b) by 183 days.

(21) Appl. No.: 15/752,352

(22) PCT Filed: Mar. 18, 2016

(86) PCT No.: PCT/CN2016/076757
§ 371 (c)(1),
(2) Date: Feb. 13, 2018

(87) PCT Pub. No.: WO2017/156778
PCT Pub. Date: Sep. 21, 2017

(65) Prior Publication Data
US 2019/0004087 A1 Jan. 3, 2019

(51) Int. Cl.
*G01R 1/04* (2006.01)
*H04M 1/24* (2006.01)
*G01R 1/067* (2006.01)

(52) U.S. Cl.
CPC ....... *G01R 1/0408* (2013.01); *G01R 1/06705* (2013.01); *H04M 1/24* (2013.01)

(58) Field of Classification Search
None
See application file for complete search history.

(56) References Cited

U.S. PATENT DOCUMENTS

2007/0152694 A1  7/2007  Yin et al.

FOREIGN PATENT DOCUMENTS

| CN | 201662607 | 12/2010 |
| CN | 102004484 | 4/2011 |
| CN | 102513989 | 6/2012 |
| CN | 203587761 | 5/2014 |
| CN | 104158933 | 11/2014 |
| CN | 204362143 | 5/2015 |

OTHER PUBLICATIONS

Translation CN102513989 (Year: 2012).*
International search report dated Dec. 14, 2016 from corresponding application No. PCT/CN2016/076757.

* cited by examiner

*Primary Examiner* — Paresh Patel
(74) *Attorney, Agent, or Firm* — Hauptman Ham, LLP

(57) ABSTRACT

An electronic product test jig includes a key testing unit and a circuit testing unit. The key testing unit includes: an X-axis mechanical arm, a Y-axis mechanical arm, a depression mechanical arm that are connected in succession; wherein the X-axis mechanical arm; and a key depression test head disposed at one end of the depression mechanical arm. The X-axis mechanical arm, the Y-axis mechanical arm, and the depression mechanical arm are configured to drive the key depression test head to move and fall over key positions of a product under test so as to complete the test of keys through the key depression test head. A pressure sensor is disposed on the key depression test head.

13 Claims, 8 Drawing Sheets

ELECTRONIC PRODUCT TEST JIG

RELATED APPLICATIONS

The present application is a National Phase of International Application Number PCT/CN2016/076757, filed Mar. 18, 2016.

TECHNICAL FIELD

The present disclosure relates generally to test equipment for testing electronic products, and more particularly relates to a test jig used for testing electronic products such as a tablet computer or a mobile phone.

BACKGROUND

Product quality testing is currently a very important part in the manufacture of electronic products such as tablet computers or mobile phones. Test items typically include: key sensitivity test, test of the working status and performance of the screen and various internal components, test of conductivity of the internal assembled circuitry, test of whether various components are operative by means of virtual programs after they are assembled, and so on.

Regarding the key testing unit, existing test jig designs are relatively simple, and a cylinder is generally employed to drive a key depression test head to conduct test of the keys of the product to be tested. In practice, the cylinder drives the key depression test head to move in the direction of the keys until the key depression test head presses on the keys. But the testers have found that during such tests, there is no way to control the pressing force of the key depression test head. As such, when the pressing force is too large, it would easily cause the keys to be damaged, otherwise when the pressing force is too small, the key depression test head would not be in full contact with the keys or the pressing force would be insufficient causing the test result inaccurate.

In order to address the above problem, a pressure sensor needs to be installed to monitor and control the pressing force of the key depression test head within the specified range. With the above-described cylinder configuration design, however, it would be impossible to install the pressure sensor, so other alternative schemes need to be considered to substitute the above cylinder configuration design.

In addition, regarding the circuit testing unit, the test connection ports are usually implemented as male or female terminals matched with the flex circuits of the product to be tested. Such male-and-female connections can easily cause wear and tear to the terminals of the flex circuits of the product under test, and so cannot meet the requirements for fine products.

SUMMARY

According to one aspect of the disclosure, an electronic product test jig is provided with a pressure sensor equipped on the key depression test head of the key testing unit of the electronic product test jig. Thus, in practical testing the key depression test head can be controlled to perform depression test of the product keys with a pressing force lying within the rated range, thereby preventing the pressing force from becoming excessively large to damage the keys of the product under test or from becoming exceedingly small to lead to inaccurate test results.

According to another aspect of the disclosure, an electronic product test jig is provided in which a key testing unit has the advantages of reasonable structural design, small size and low cost, and the structure of the key testing unit is suitable for installing a pressure sensor.

According to yet another aspect of the disclosure, an electronic product test jig is provided in which a circuit testing unit uses test needles to contact the flex circuits of the product under test for testing purposes, and meanwhile appropriate suction and clamping devices are used to stabilize the flex circuits of the product under test avoiding the occurrence of poor contact during the testing process so that a stable contact can be achieved between the test needles and the flex circuits' terminals of the product under test.

According to still another aspect of the disclosure, an electronic product test jig is provided in which an inner template of a circuit testing unit is operative to clamp the product under test and is at the same time operative to turn and rotate thus facilitating the tester to connect the flex circuits of the product under test to a needle assembly for testing purposes. After the product to be tested is placed on the inner template, the inner template rotates to expose the flex circuits of the product under test, thus facilitating the tester to connect the flex circuits of the product under test to the needle assembly, while after completion of connection of the flex circuits, the inner template rotates in reverse exposing the screen of the product under test to facilitate the tester with viewing and testing.

Technical solutions adopted by this disclosure are as follows.

In some embodiments, an electronic product test jig is proposed that includes a key testing unit and a circuit testing unit. The key testing unit includes an X-axis mechanical arm, a Y-axis mechanical arm, a depression mechanical arm, and a key depression test head. The X-axis mechanical arm, the Y-axis mechanical arm, and the depression mechanical arm are connected in succession. The key depression test head is disposed at one end of the depression mechanical arm. The X-axis mechanical arm, the Y-axis mechanical arm, and the depression mechanical arm are operative to drive the key depression test head to move and fall over key positions of a product under test so as to complete the key test by the key depression test head. A pressure sensor is disposed on the key depression test head.

In some embodiments, an electronic product test jig is provided in which the depression mechanical arm includes a Y-axis connecting plate connected to the Y-axis mechanical arm, a motor disposed on the Y-axis connecting plate, and an actuating unit connected between the motor and the key depression test head. The actuating unit is configured to convert a driving force of the motor and further drive the key depression test head to perform a reciprocating up and down depression test motion.

In some embodiments, an electronic product test jig is provided in which the actuating unit includes a ballscrew nut, a nut fixing plate, equal-height screws, and a slide block. The ballscrew nut is screwed with a rotary screw of the motor, so that when the motor is operating, the rotary screw is operative to rotate and the ballscrew nut is operative to reciprocate up and down along the rotary screw by means of the cooperation between the ballscrew nut and the rotary screw.

In some embodiments, an electronic product test jig is provided in which the ballscrew nut is fixedly disposed on the nut fixing plate, and the equal-height screws are connected between the nut fixing plate and the slide block. A lower end of each of the equal-height screws is fixedly connected to the slide block, while a top end of each of the equal-height screw is inserted into a corresponding through-hole defined in the nut fixing plate, and the key depression test head is disposed below the slide block. The nut fixing plate, the equal-height screws, the slide block, and the key depression test head are operative to reciprocate up and down synchronously with the ballscrew nut so as to complete the depression test motion.

In some embodiments, an electronic product test jig is provided in which the pressure sensor is installed on the slide block and disposed on the top of the key depression test head.

In some embodiments, an electronic product test jig is provided in which each of the equal-height screws is sleeved in a spring located between the nut fixing plate and the slide block. These springs are configured to offer buffering effects for the key depression test head when the key depression test head is performing the depression testing motion.

In some embodiments, an electronic product test jig is provided in which the slide block is slidably connected to a motion rail installed on a side surface of a rail mounting plate. The top of the rail mounting plate is connected to the lower end of the Y-axis connecting plate, and the slide block is operative to reciprocate up and down along the motion rail during the depression test motion.

In some embodiments, an electronic product test jig is provided in which a displacement sensing chip is further installed on the nut fixing plate.

In some embodiments, an electronic product test jig is provided in which the circuit testing unit further includes an inner template, a needle assembly, and a rotary motor. A carrier plate is disposed on the top of the rack, the inner template is disposed under the carrier plate, and the rotary motor is disposed at one end of the inner template and is operative to drive the inner template to rotate. The inner template is defined with a notch, and the needle assembly is disposed below the notch and coupled to a motherboard test assembly.

In some embodiments, an electronic product test jig is provided in which a plurality of vacuum nozzles are arranged on the inner template. The needle assembly includes at least one connecting flex circuit, with a lower end of the at least one connecting flex circuit coupled to a motherboard test assembly and a top end of the at least one connecting flex circuit coupled to test needles in the needle assembly, wherein the test needles in the needle assembly are disposed in at least one test port. The needle assembly further includes a flex circuit suction head provided with suction nozzles, and a flex circuit clamping block operative to clamp the flex circuits of the product under test thus bringing connecting terminals of the flex circuits of the product under test into close contact with the test needles. A clamping door is further pivotally connected on each side of the flex circuit suction head, and the clamping doors are operative to clamp the flex circuits of the product under test tightly onto the flex circuit suction head.

In some embodiments, an electronic product test jig is provided in which the rotary motor is disposed at one end of the inner template and is connected to the end of the inner template through a coupling. The other end of the inner template is connected to the rack through a bearing, so that when the inner template needs to rotate, the rotary motor is configured to operate and the inner template is operative to rotate about its own axis by means of the coupling and the bearing.

This disclosure can have the following advantages.

In accordance with the disclosure, a pressure sensor is equipped on the key depression test head of the key testing unit. Thus, in practical testing the key depression test head can be controlled to perform depression test of the product keys with a pressing force lying within the rated range, thereby preventing the pressing force from becoming excessively large to damage the keys of the product under test or from becoming exceedingly small to lead to inaccurate test results. In addition, the key depression test head of the key testing unit has advantages of reasonable structural design, small size, and low cost, and the structure is suitable for installing a pressure sensor.

In addition, in accordance with this disclosure, the circuit testing unit uses test needles to contact the flex circuits of the product under test for testing purposes, and meanwhile adaptive suction and clamping devices are used to stabilize the flex circuits of the product under test avoiding the occurrence of poor contact during the testing process so that a stable contact can be achieved between the test needles and the flex circuits' terminals of the product under test. Furthermore, in accordance with the disclosure, the inner template of the circuit testing unit is operative to clamp the product under test and at the same time is operative to turn and rotate thus facilitating the tester to connect the flex circuits of the product under test to the needle assembly for testing purposes, and after the product to be tested is placed on the inner template, the inner template can rotate to expose the flex circuits of the product under test, thus facilitating the tester to connect the flex circuits of the product under test to the needle assembly, while after completion of connection of the flex circuits, the inner template rotates in reverse exposing the screen of the product under test to facilitate the tester with viewing and testing.

BRIEF DESCRIPTION OF THE ACCOMPANYING DRAWINGS

DETAILED DESCRIPTION OF ILLUSTRATIVE EMBODIMENTS

Figure 1:
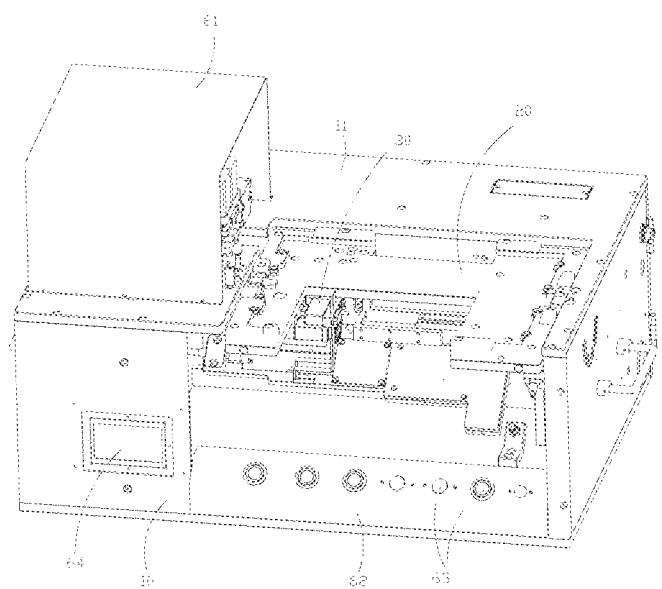
FIG. 1 is a schematic perspective view of an electronic device test jig in accordance with an embodiment.
Figure 2:
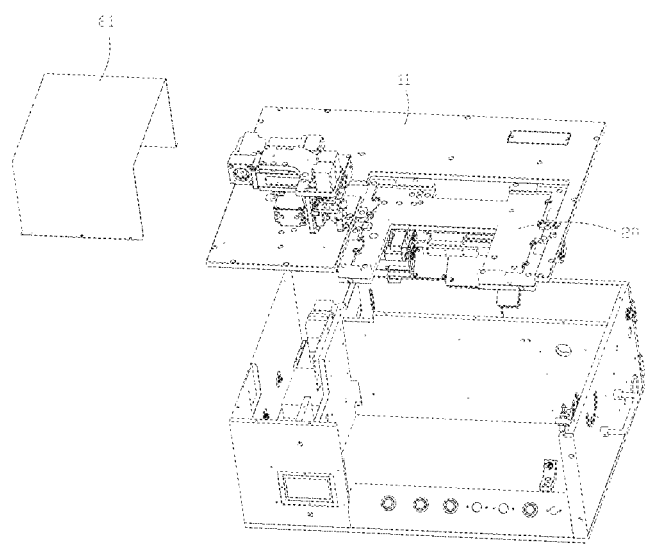
FIG. 2 is an exploded perspective view of an electronic device test jig in accordance with an embodiment.
Figure 3:
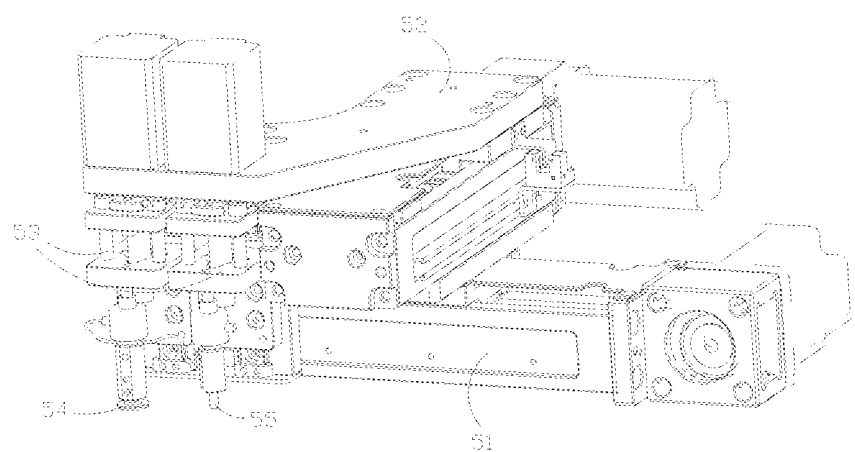
FIG. 3 is a schematic perspective view illustrating a key testing unit of an electronic device test jig in accordance with an embodiment.
Figure 4:
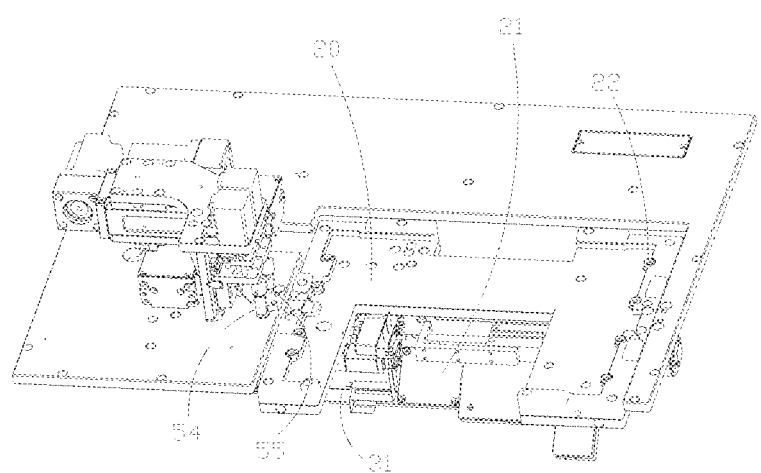
FIG. 4 is a schematic perspective view illustrating a key testing unit and a circuit testing unit of an electronic device test jig in accordance with an embodiment.

In some embodiments, as illustrated in FIGS. 1 to 8, an electronic product test jig includes a key testing unit and a circuit testing unit.

In practice, an electronic product to be tested, such as a tablet computer or a mobile phone, can be placed on the electronic product test jig to be tested respectively by the key testing unit and the circuit testing unit, thereby achieving the purpose of screening out the defective products.

In some embodiments, as illustrated in FIGS. 1 to 4, the electronic product test jig further includes a rack 10, and both the key testing unit and the circuit testing unit are disposed on the rack 10. The circuit testing unit may include an inner template 20, a needle assembly 30, and a rotary motor.

In some embodiments, a carrier plate 11 is disposed on the top of the rack 10. The inner template 20 is disposed under the carrier plate 11. The rotary motor is disposed at one end of the inner template 20 and is operative drive the inner template 20 to rotate.

In some embodiments, the inner template 20 is defined with a notch 21 so that when an electronic product such as a tablet computer or a mobile phone is placed on the inner template 20, the ports and sockets of the electronic product can be exposed from the notch 21 to facilitate test.

The needle assembly 30 may be located below the notch 21.

The needle assembly 30 may be coupled to the motherboard test assembly 31. The motherboard test assembly 31 can be of different types, such as the MLB assembly from the Apple Inc., depending on the product under test.

In some embodiments, the inner template 20 is provided with a plurality of vacuum nozzles 22, through which the product under test can be more stably placed on the inner template 20.

The key testing unit may be disposed on the top end of the rack 10 and may include an X-axis mechanical arm 51, a Y-axis mechanical arm 52, a depression mechanical arm 53, and a key depression test head.

The X-axis mechanical arm 51, the Y-axis mechanical arm 52, and the depression mechanical arm 53 may be connected in succession. The key depression test head may be disposed at one end of the depression mechanical arm 53.

The X-axis mechanical arm 51, the Y-axis mechanical arm 52, and the depression mechanical arm 53 are configured to drive the key depression test head to operate and fall at the key positions of the product under test. In this manner, the key depression test head can be used to complete the keys test.

In some embodiments, a pressure sensor 56 is disposed at the key depression test head.

Figure 5:
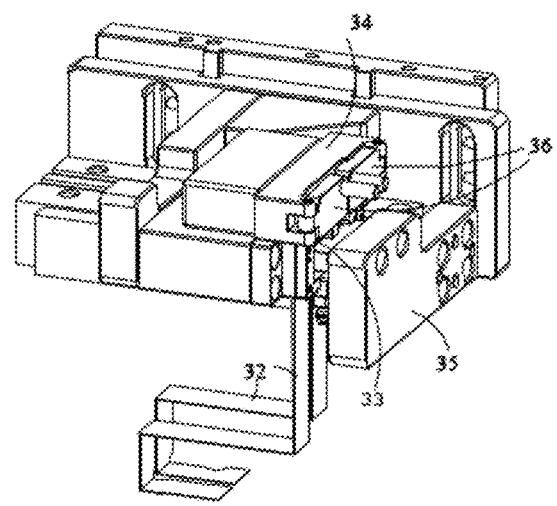
FIG. 5 is a schematic perspective view illustrating a key testing unit of an electronic device test jig in accordance with an embodiment.
Figure 6:
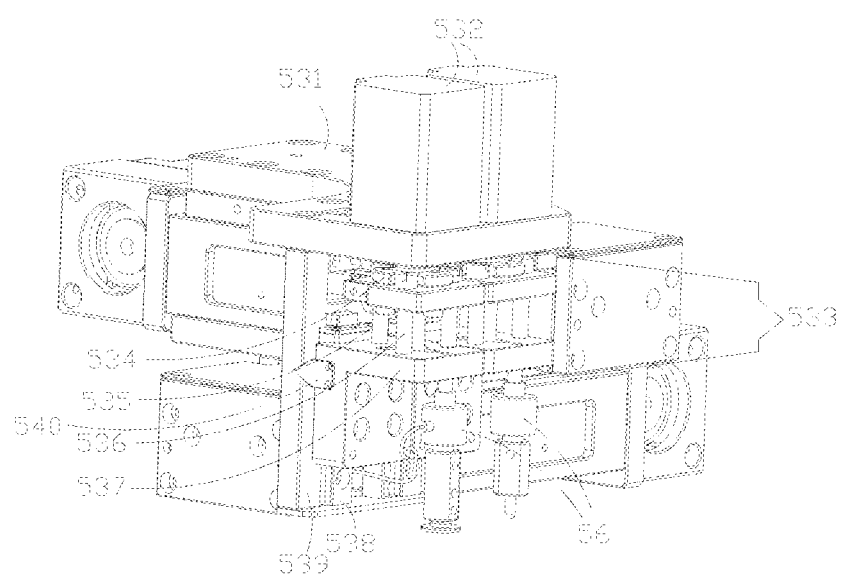
FIG. 6 is a schematic perspective view illustrating a circuit testing unit of an electronic device test jig in a closed state in accordance with an embodiment.

In some embodiments, as illustrated in FIG. 5, the depression mechanical arm 53 includes a Y-axis connecting plate 531, a motor 532, and an actuating unit 533. The Y-axis connecting plate 531 is connected to the Y-axis mechanical arm 52. The motor 532 is disposed on the Y-axis connecting plate 531. The actuating unit 533 is connected between the motor 532 and the key depression test head. Thus, the driving force of the motor 532 can be subjected to the conversion of the actuating unit 533 and so drive the key depression test head to perform reciprocating up and down depression test motion.

In some embodiments, the actuating unit 533 includes a ballscrew nut 534, a nut fixing plate 535, equal-height screws 536, and a slide block 537.

The ballscrew nut 534 is screwed with a rotary screw of the motor 532, so that when the motor 532 is operating the rotary screw will rotate and so the ballscrew nut 534 can reciprocate up and down along the rotary screw through the cooperation between the ballscrew nut 534 and the rotary screw.

The ballscrew nut 534 may be fixedly disposed on the nut fixing plate 535.

The equal-height screws 536 may be connected between the nut fixing plate 535 and the slide block 537.

For each of the equal-height screws 536, the lower end of the screw may be fixedly connected to the slide block 537, while the top end of the screw may be inserted into a corresponding through-hole defined in the nut fixing plate 535.

In some embodiments, each of the equal-height screws 536 is sleeved in a spring (not shown) which is located between the nut fixing plate 535 and the slide block 537. Thus, these springs can provide buffering effects for the key depression test head when the key depression test head is performing the depression testing motion, thereby preventing the key depression test head from crushing the product under test.

The key depression test head may be disposed on the underside of the slide block 537.

The nut fixing plate 535, the equal-height screws 536, the slide block 537, and the key depression test head are operative to reciprocate up and down synchronously with the ballscrew nut 534 so as to complete the depression test operation.

In some embodiments, the pressure sensor 56 is installed on the slide block 537, and disposed on the top of the key depression test head.

In some embodiments, in order to enable the slide block 537 to move smoothly, the slide block 537 is slidably connected to a motion rail 538 which is disposed on the side surface of a rail mounting plate 539. The top of the rail mounting plate 539 may be connected to the lower end of the Y-axis connecting plate 531. Thus, in performing the depression test motion, the slide block 537 is operative to slide up and down along the motion rail 538.

In some embodiments, a displacement sensing chip (not shown) is further installed on the nut fixing plate 535 to determine the position of the start point (equivalent to marking the position of the origin), so as to determine the travel to be performed by the motor 532.

In some embodiments, a movable indicator 540 is further disposed on the slide block 537. The movable indicator 540 is operative to move up and down synchronously with the slide block 537.

In some embodiments, corresponding to the movable indicator 540, a scale is provided on the rail mounting plate 539 whereby the human eye can directly observe the position that moves up and down.

In some embodiments, a controller is used to predetermine the distance to be moved down for purposes of preventing the test head from depressing and damaging the product under test, as well as improving the test efficiency.

In some embodiments, the key depression test head includes a first pressing test head 54 and a second pressing test head 55. Both the first pressing test head 54 and the second pressing test head 55 perform the test of keys by way of pressing, only the specific models of the test heads are different. The X-axis mechanical arm 51 may be disposed on the top of the rack 10, the Y-axis mechanical arm 52 may be disposed on the upper side of the X-axis mechanical arm 51, while the depression mechanical arm 53 may be disposed on one end of the Y-axis mechanical arm 52.

When operating the electronic product test jig in accordance with this disclosure, the tester first needs to place the product to be tested on the inner template 20 and then press the start button so that the product will be sucked tight by the vacuum nozzles on the inner template 20. The inner template 20 then rotates to bring the test needles of the needle assembly 30 into contact with the circuits to be tested thus starting the test. Thereafter, the inner template 20 rotates and the product is also rotated along with the inner template 20 to a horizontal position, at which the X-axis mechanical arm 51, the Y-axis mechanical arm 52, and the depression mechanical arm 53 are actuated and further perform test of the product keys through the first pressing test head 54 and the second pressing test head 55 respectively.

In some embodiments, the key testing unit as a whole is covered in a protective cover 61, and a console 62 is disposed on the rack 10. A number of control buttons 63 may be configured on the console 62. In addition, a real-time display 64 may also be disposed on the rack 10, and the real-time display 64 is operative to display the test results and the test status in real time.

Typically, the connection ports of the circuit test unit of an existing test jig are designed as male or female terminals matched with the flex circuits of the product to be tested. Because the connection is implemented as the connection between male and female terminals, it may easily cause wear and tear of the terminals of the flex circuits of the product under test. To avoid the occurrence of the above-mentioned situation, the inventor(s) employs a needle connection, which, however, is prone to poor contact. Therefore, a corresponding structure needs to be designed to enable a stable contact between the test needles and terminals of the flex circuits of the product under test. The specific technical details are as follows.

Figure 7:
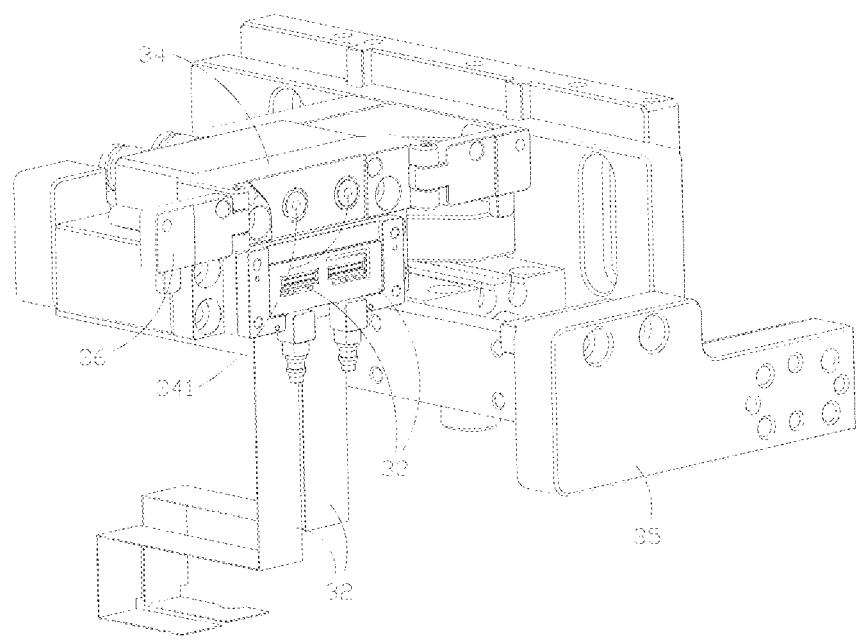
FIGS. 7 and 8 are schematic perspective views illustrating circuit testing units of an electronic device test jig in an open state in accordance with various embodiments.

In some embodiments, as illustrated in FIG. 7, the needle assembly 30 includes at least one connecting flex circuits 32. The lower end of the at least one connecting flex circuits 32 may be coupled to the motherboard test assembly 31, while the top end of the at least one connecting flex circuit 32 may be coupled to the test needles in the needle assembly 30. The test needles in the needle assembly 30 may be disposed in at least one test port 33.

During the test, the connecting terminals (not shown) of the flex circuits of the product under test are coupled to the at least one test port 33 so that the flex circuits of the product under test are brought into contact with the test needles in the at least one test port 33 thus starting the test operation.

In the above-described process, to stabilize the flex circuits of the product under test thus enabling a stable contact between the test needles and the flex circuits' terminals of the product under test, the inventor(s) has designed the following technical solution.

In some embodiments, the needle assembly 30 further includes a flex circuit suction head 34 that is provided with suction nozzles 341. During the test, the suction nozzles 341 are operative suck the flex circuits of the product under test and thus fix the position of the flex circuits, and can at the same time prevent rebounding of the flex circuits of the product under test.

In some embodiments, the needle assembly 30 further includes a flex circuit clamping block 35 that is operative to clamp tight the flex circuits of the product under test so that the connecting terminals of the flex circuits of the product under test would be in close contact with the test needles.

Figure 8:
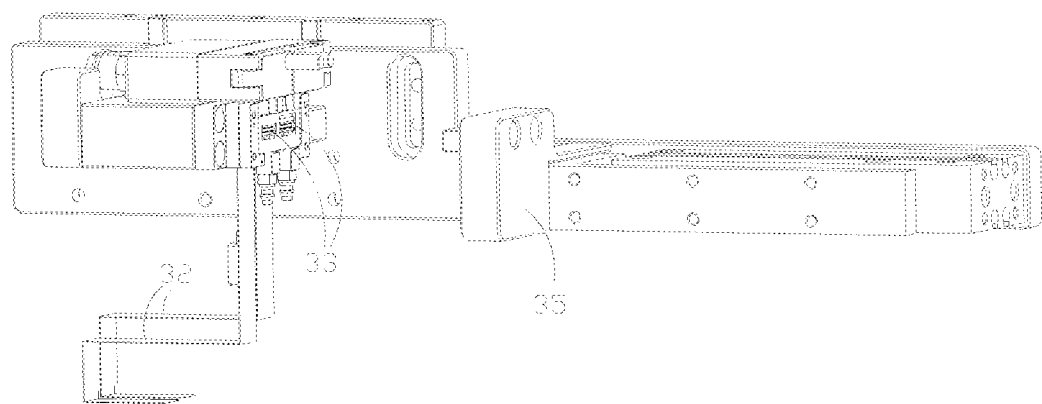

In some embodiments, the flex circuit clamping block 35 is driven by a cylinder which may be disposed on the left or right side of the flex circuit clamping block 35, typically on the right as illustrated in FIG. 8. When set to the right, the cylinder would be able to exert greater pressure, avoiding the occurrence of poor contact between the test needles and the flex circuits under test due to insufficient pressure in the cylinder.

In order to further immobilize the spatial position of the flex circuits of the product under test, in some embodiments a clamping door 36 is pivotally connected on each side of the flex circuit suction head 3. The clamping doors 36 are operative to clamp the flex circuits of the product under test tightly onto the flex circuit suction head 34.

The left and right clamping doors 36 are provided for standby purposes but not essential; they are to be used in case the suction nozzles 341 go faulty. In some embodiments, the clamping doors 36 implement the clamping by means of magnetic attraction.

In some embodiments, the rotary motor is disposed at one end of the inner template 20. The rotary motor can be coupled to the end of the inner template 20 through a coupling, while the other end of the inner template 20 may be connected to the rack 10 through a bearing. Thus, when the inner template 20 needs to rotate, the rotary motor can be actuated and so enable the inner template 20 to rotate about its own axis by means of the coupling and the bearing.

The above rotational action of the inner template 20 is intended to facilitate the tester to connect the flex circuits of the product under test to the needle assembly 30 for testing purposes. Therefore, after the product under test is placed on the inner template 20, the inner template 20 is operative to rotate exposing the flex circuits of the product under test, thus facilitating the tester to connect the flex circuits of the product under to the needle assembly 30. After completing the connection of the flex circuits, the inner template 20 is operative to rotate in reverse to expose the screen of the product under test facilitating the tester with viewing and testing.

What is claimed is:

1. An electronic product test jig, comprising:
   a key testing unit; and
   a circuit testing unit;
   wherein the key testing unit comprises an X-axis mechanical arm, a Y-axis mechanical arm, and a depression mechanical arm that are connected in succession, and a key depression test head disposed at one end of the depression mechanical arm; the X-axis mechanical arm, the Y-axis mechanical arm, and the depression mechanical arm are configured to drive the key depression test head to move and fall over key positions of a product under test so as to complete the test of keys through the key depression test head; and a pressure sensor is disposed on the key depression test head,
   wherein the circuit testing unit comprises an inner template, a needle assembly, and a rotary motor, wherein a carrier plate is disposed on the top of a rack, the inner template is disposed under the carrier plate, and the rotary motor is disposed at one end of the inner template and is operative to drive the inner template to rotate; and the inner template is defined with a notch, and the needle assembly is disposed under the notch and coupled to a motherboard test assembly, and
   wherein a plurality of vacuum nozzles are disposed on the inner template, the needle assembly comprises at least one connecting flex circuit, with a lower end of the at least one connecting flex circuit coupled to the motherboard test assembly and a top end of the at least one connecting flex circuit coupled to test needles in the needle assembly; the test needles in the needle assembly are disposed in at least one test port, the needle assembly further comprises a flex circuit suction head provided with suction nozzles, and a flex circuit clamping block operative to clamp flex circuits of the product under test thus bringing connecting terminals of the flex circuits of the product under test into close contact with the test needles; and a clamping door is pivotally connected on each side of the flex circuit suction head, wherein the clamping doors are operative to clamp the flex circuits of the product under test tightly onto the flex circuit suction head.

2. The electronic product test jig according to claim 1, wherein the depression mechanical arm comprises a Y-axis connecting plate connected to the Y-axis mechanical arm, a motor disposed on the Y-axis connecting plate, and an actuating unit connected between the motor and the key depression test head and configured to convert a driving force of the motor and thus drive the key depression test head to perform a reciprocating up and down depression test motion.

3. The electronic product test jig according to claim 2, wherein the actuating unit comprises a ballscrew nut, a nut fixing plate, equal-height screws, and a slide block, and wherein the ballscrew nut is screwed with a rotary screw of the motor so that when the motor is operating, the rotary screw is operative to rotate and the ballscrew nut is operative to reciprocate up and down along the rotary screw by means of the cooperation between the ballscrew nut and the rotary screw;

wherein the ballscrew nut is fixedly disposed on the nut fixing plate, and the equal-height screws are connected between the nut fixing plate and the slide block, wherein a lower end of each of the equal-height screws is fixedly connected to the slide block, and a top end of each of the equal-height screw is inserted into a corresponding through-hole defined in the nut fixing plate, and the key depression test head is disposed below the slide block, wherein the nut fixing plate, the equal-height screws, the slide block, and the key depression test head are operative to reciprocate up and down synchronously with the ballscrew nut so as to compete the depression test motion.

4. The electronic product test jig according to claim 3, wherein the pressure sensor is installed on the slide block and disposed on the top of the key depression test head.

5. The electronic product test jig according to claim 3, wherein each of the equal-height screws is sleeved in a spring located between the nut fixing plate and the slide block, and wherein the springs are configured to offer buffering effects for the key depression test head when the key depression test head is performing the depression test motion.

6. The electronic product test jig according to claim 3, wherein the slide block is slidably connected to a motion rail installed on a side surface of a rail mounting plate, wherein the top of the rail mounting plate is connected to the lower end of the Y-axis connecting plate, and the slide block is operative to reciprocate up and down along the motion rail during the depression test motion.

7. The electronic product test jig according to claim 3, wherein a displacement sensing chip is further installed on the nut fixing plate.

8. The electronic product test jig according to claim 1, wherein the rotary motor is disposed at one end of the inner template and is connected to the end of the inner template through a coupling, and wherein the other end of the inner template is connected to the rack through a bearing, so that when the inner template needs to rotate, the rotary motor is configured to operate and so the inner template is operative to rotate about its own axis by means of the coupling and the bearing.

9. The electronic product test jig according to claim 6, wherein a movable indicator is further disposed on the slide block, and corresponding to the movable indicator a scale is provided on the rail mounting plate.

10. The electronic product test jig according to claim 1, further comprising a controller configured to predetermine the distance for the key depression test head to be moved down to prevent the key depression test head from depressing and damaging the product under test.

11. The electronic product test jig according to claim 1, wherein the key depression test head comprises a first pressing test head and a second pressing test head that are of different types.

12. The electronic product test jig according to claim 1, wherein the key testing unit as a whole is covered in a protective cover.

13. The electronic product test jig according to claim 1, wherein a real-time display is disposed on a rack and is operative to display the test results and test status in real time.

* * * * *